US006232680B1

(12) United States Patent
Bae et al.

(10) Patent No.: US 6,232,680 B1
(45) Date of Patent: May 15, 2001

(54) COOLING APPARATUS FOR ELECTRONIC DEVICE

(75) Inventors: Byoung-young Bae, Songtanjiyeok Pyeongtaek; Soon-kyo Hong; Bu-hyun Sung, both of Seoul; Hong-kyun Yim, Suwon; Yong-jun Kim, Seongnam, all of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/480,924

(22) Filed: Jan. 12, 2000

(30) Foreign Application Priority Data

Jan. 13, 1999 (KR) ........................................... 99-719

(51) Int. Cl.$^7$ ........................... F04B 43/04; H02K 33/02
(52) U.S. Cl. .......................... 310/17; 310/16; 417/413.1
(58) Field of Search ................... 310/16, 17; 417/410.1, 417/412, 413.1, 415, 416, 417, 418

(56) References Cited

U.S. PATENT DOCUMENTS 5,599,174  *  2/1997  Cook et al. ...................... 417/413.1

FOREIGN PATENT DOCUMENTS 47-31203    5/2000  (JP).

* cited by examiner

Primary Examiner—Nestor Ramirez
Assistant Examiner—Judson H. Jones
(74) Attorney, Agent, or Firm—Sughrue, Mion, Zinn, Macpeak & Seas, PLLC

(57) ABSTRACT

An apparatus for cooling an electronic device includes a case where a plurality of air intake/exhaust holes through which air passes are formed. A plate type mobile member is installed to vibrate in the case and divides an inner space of the case into an upper space and a lower space. An elastic support film is fixed in the case to support the mobile member and has a bulged portion capable of being elastically deformed. A driving device is provided for vibrating the mobile member. By the vibration of the mobile member, air in the upper and lower spaces of the case is exchanged with outside air through the air intake/exhaust holes so that a heat source is cooled.

16 Claims, 5 Drawing Sheets

COOLING APPARATUS FOR ELECTRONIC DEVICE

BACKGROUND OF THE INVENTION

1. Field of the Invention

The present invention relates to an apparatus for cooling a heat source in an electronic device by making air flow therein.

2. Description of the Related Art

In general, electronic devices such as a computer include an IC chip, for example, a central processing unit (CPU). The CPU is mounted on a printed circuit board (PCB) and driven by being electrically connected to a circuit pattern. A semiconductor device such as the CPU dissipates heat as power is consumed during operation thereof. Therefore, to prevent malfunction of the device due to the heat, an apparatus for cooling the device is needed.

FIG. 1 shows a sectional view of a conventional cooling apparatus adopted in an electronic device. Referring to the drawing, the cooling apparatus includes a case 10, an elastic film 13 installed across space in the case 10, and a magnet 14 installed at the central portion of the elastic film 13.

The case 10 includes a frame 11 and a cover member 12. An aperture 12a through which air passes is formed in the cover member 12. A coil 15 is supported at the edge of the aperture 12a. An opening 10a through which air passes is formed at the lower surface of the frame 11.

When current is applied to the coil 15, the magnet 14 is moved by an interactive electromagnetic force with the coil 15. The elastic film 13 is deformed according to movement of the magnet 14 and then restored by an elastic restoring force, thereby repeating vibrating actions. When the air in the case 10 flows due to the vibration of the elastic film 13, the air is injected out of the case 10 through the opening 10a. The injected air cools a heat source 20 such as a CPU installed adjacent to the opening 10a.

However, as the elastic film 13 repeats the vibrating action for a long time, the elastic force of the elastic film 13 is lowered due to fatigue so that the elastic film 13 easily tears or is broken. Also, as the width of vibration of the elastic film 13 is relatively small, the amount of air flow is small and thus the efficiency of cooling is relatively low. Hence, it is a problem that an additional heat sink must be installed.

SUMMARY OF THE INVENTION

To solve the above problem, it is an objective of the present invention to provide an apparatus for cooling an electronic device having an improved structure so that durability and the efficiency of cooling is improved.

Accordingly, to achieve the above objective, there is provided an apparatus for cooling an electronic device which comprises a case where a plurality of air intake/exhaust holes through which air passes are formed, a plate type mobile member installed to vibrate in the case to divide an inner space of the case into an upper space and a lower space, an elastic support film fixed in the case to support the mobile member and having a bulged portion capable of being elastically deformed, and a driving device for vibrating the mobile member. Here, by the vibration of the mobile member, air in the upper and lower spaces of the case is exchanged with outside air through the air intake/exhaust holes so that a heat source is cooled.

It is preferable in the present invention that the apparatus for cooling an electronic device further comprises a heat sink installed between the case and the heat source for cooling heat transferred from the heat source by being exposed to the air flow.

Also, it is preferable in the present invention that at least one of the air intake/exhaust holes is formed at the lower surface of the case and the heat sink is installed to be separated a predetermined distance from the lower surface of the case, so that air flowing through the air intake/exhaust hole of the lower surface cools the heat sink.

Also, it is preferable in the present invention that a pad is further provided between the heat sink and the heat source to absorb impact transferred to the heat source.

Also, it is preferable in the present invention that the driving device comprises a magnet installed on a ceiling or bottom of the case to face the mobile member, and a coil installed at the mobile member to correspond to the magnet, wherein the mobile member vibrates up and down by an interactive electromagnetic force occurring between the coil and the magnet.

To achieve the above objective, there is provided an apparatus for cooling an electronic device which comprises a case where a plurality of air intake/exhaust holes through which air passes are formed, an elastic film installed in the case to be capable of vibrating and dividing inner space of the case into an upper space and a lower space, a driving device for vibrating the mobile member, and a heat sink installed between the case and the heat source for transferring heat from a heat source, wherein, by the vibration of the elastic film, air in the upper and lower spaces of the case is exchanged with outside air through the air intake/exhaust holes so that the heat sink is cooled.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 2A:
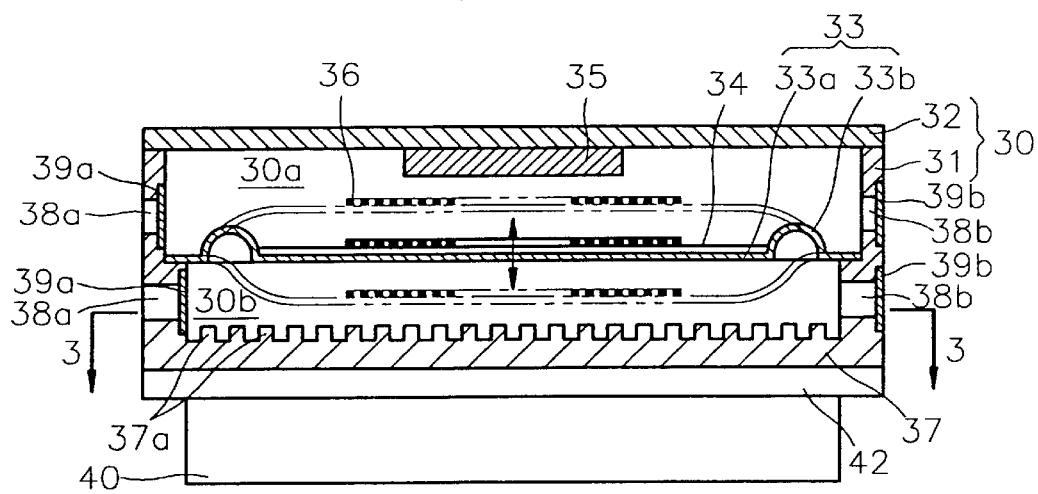
FIG. 2A is a sectional view showing an apparatus for cooling an electronic device according to a first preferred embodiment of the present invention.

Referring to FIG. 2A, a cooling apparatus includes a case 30 having air intake/exhaust holes 38a and 38b, a mobile member 34 installed to be capable of vibrating in the case 30, an elastic support film 33 for supporting the mobile member 34, a driving device for driving the mobile member 34, and a heat sink 37. The cooling apparatus having the above structure installed in an electronic product such as a notebook computer is to cool a heat source 40 such as a central processing unit (CPU).

The case 30 includes a box type frame 31 and a cover member 32 coupled to the upper surface of the frame 31. The inner space of the frame 31 is divided by the mobile member 34 horizontally installed into an upper space 30a and a lower space 30b. The upper space 30a and the lower space 30b each have an air inlet hole 38a and an air outlet hole 38b which are formed at the side surface of the frame 31. Also, a first covering member 39a and a second covering member 39b for opening and closing the holes 38a and 38b, respectively, are provided.

The mobile member 34 is formed of a thin plate such as PCB (printed circuit board) which can vibrate by a small driving force and is supported at the inner wall of the frame 31 by the elastic support film 33. The end portion of the elastic support film 33 is attached to the inner wall of the frame 31 using an adhesive.

The elastic support film 33 has a support portion 33a for supporting the mobile member 34 and a bulged portion 33b extended from the support portion 33a. The bulged portion 33b is elastically deformed during vibration of the mobile member 34 to increase the vibration width of the mobile member 34 and also prevent fatigue failure.

Figure 2B:
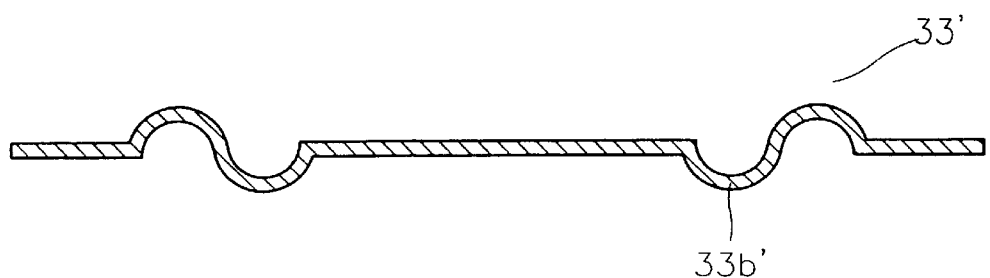
FIG. 2B is a sectional view showing the elastic support film of FIG. 2A according to another preferred embodiment of the present invention.

Alternatively, as shown in FIG. 2B, an elastic support film 33' can have a bulged portion 33b' alternately curved up and down. In this case, as the bulged portion 33b' is relatively long, the vibration width of the mobile frame 34 becomes greater.

Figure 3:
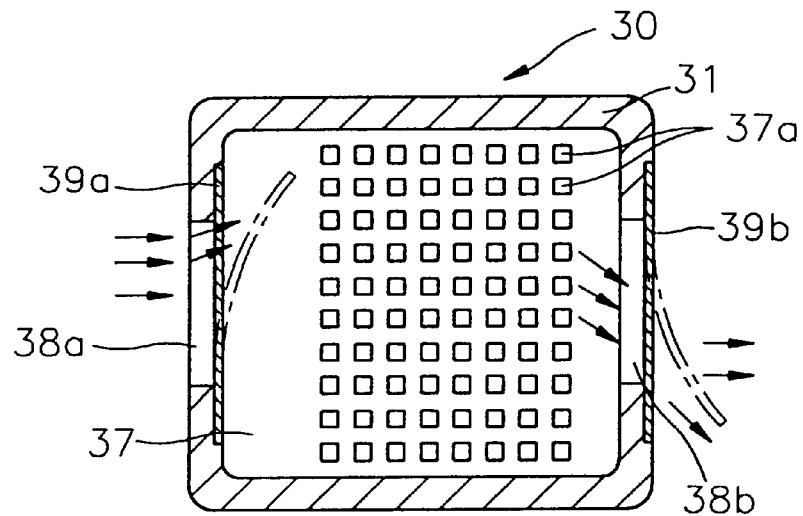
FIG. 3 is a sectional view showing a heat sink taken along line 3—3 of FIG. 2A.
Figure 4:
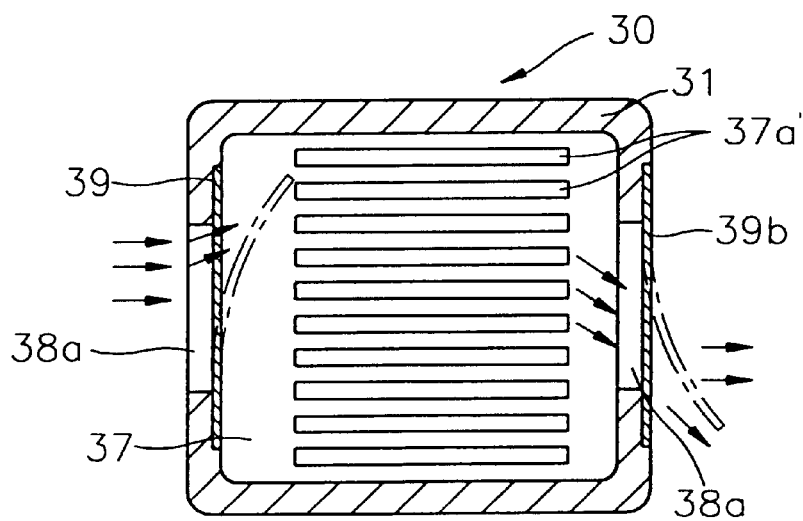
FIG. 4 is a section view showing a heat sink according to another preferred embodiment of the present invention.

Referring back to FIG. 2A, the lower side of the frame 31 is open and a heat sink 37 is installed to face the mobile member 34. Alternatively, the heat sink 37 can be formed integrally with the frame 31. The heat sink 37 is for transferring the heat generated from the heat source 40 and has a plurality of cooling fins 37a formed in the form of lattice, as shown in FIG. 3. Alternatively, the heat sink 37 can have a bar type cooling fin 37a' formed parallel to one another, as shown in FIG. 4.

The heat sink 37 can directly contact the heat source 40, or indirectly contact the heat source 40 via a pad 42, as shown in FIG. 2. The pad 42 transfers the heat from the heat source 40 to the heat sink 37 and also absorbs external impact to the heat source 40. Also, the surface of the heat sink 37 is processed by a well-known anodizing process to increase the degree of surface roughness so that the efficiency in heat transfer is improved.

The driving device includes a magnet 35 installed on the ceiling of the case 30 and a coil 36 installed at the mobile member 34 to correspond to the magnet 35. The coil 36 is formed of a pair of coils installed to be separated a predetermined distance from each other to generate an interactive electromagnetic force with the magnet 35. Preferably, the coil 36 is installed to be embedded in the surface of the mobile member 34 as a pattern.

The first covering member 39a is attached to the inner side of the case 30 to close the air inlet hole 38a, and the second covering member 39b is attached to the outer side of the case 30 to close the air outlet hole 38b. These covering members 39a and 39b are formed of a rubber material and, as indicated by imaginary lines of FIG. 3, are elastically deformed by being pushed by the air coming in and out of the case 30 to open the air inlet hole 38a and the air outlet hole 38b, respectively.

In the operation of the cooling apparatus according to a first preferred embodiment of the present invention, during the operation of the electronic product, the heat generated from the heat source 40 is transferred to the heat sink 37 via the pad 42. The heat transferred to the heat sink 37 is dissipated to the lower space 30b through the cooling fins 37a.

At this time, when current is applied to the coil 36, an electromagnetic force exists between the coil 36 and the magnet 35 and thus the mobile member 34 advances or retreats with respect to the magnet 35. The movement of the mobile member 34 is made possible as the bulged portion 33b of the elastic support film 33 is elastically deformed.

Figure 1:
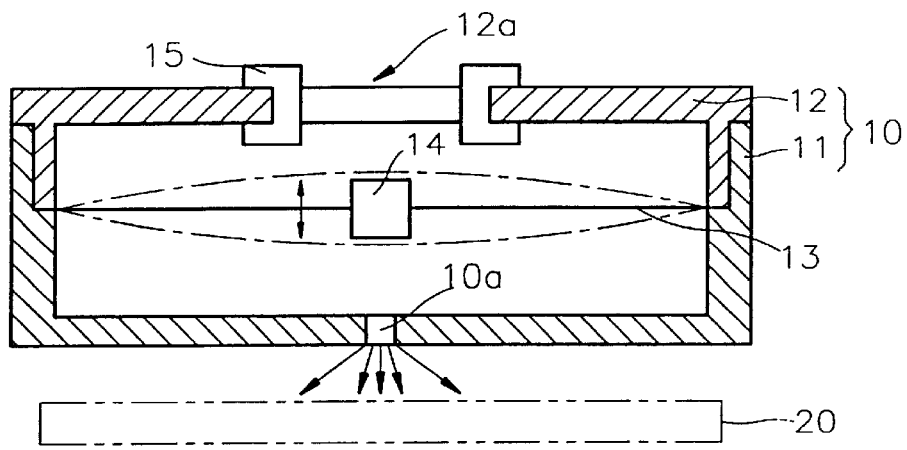
FIG. 1 is a sectional view showing the conventional apparatus for cooling an electronic, device.

When the elastic deformation of the bulged portion 33b in one direction becomes maximized, the mobile member 34 returns to the initial position by a restoring force of the bulged portion 33b and simultaneously elastically deformed in the opposite direction. That is, the mobile member 34 repeatedly vibrates up and down by the electromagnetic force and the elastic restoring force. Here, as the amount of deformation is relatively small compared to that of the conventional elastic film (13 of FIG. 1), the bulged portion 33b is not easily destroyed.

When the mobile member 34 vibrates, the volumes of the upper and lower space portions 30a and 30b change. That is, when the mobile member 34 moves upward, the volume of the upper space 30a is relatively reduced and the volume of the lower space 30b relatively increases. Thus, the pressure in the upper volume Scan 30a becomes higher than the outside pressure and the pressure in the lower volume 30b becomes lower than the outside pressure. Thus, the air inside the upper space 30a pushes the second covering member 39b to be exhausted through the air outlet hole 38b. Simultaneously, as the first covering member 39a of the lower space 30b opens, the outside air enters into the lower space 30b through the air inlet hole 38a. When the mobile member 34 is moved downward, actions are performed opposite to the above.

When the mobile member 34 vibrates at high speed, the air of the upper and lower spaces 30a and 30b quickly exchanged with the outside air so that the heat sink 37 can be cooled.

Figure 5:
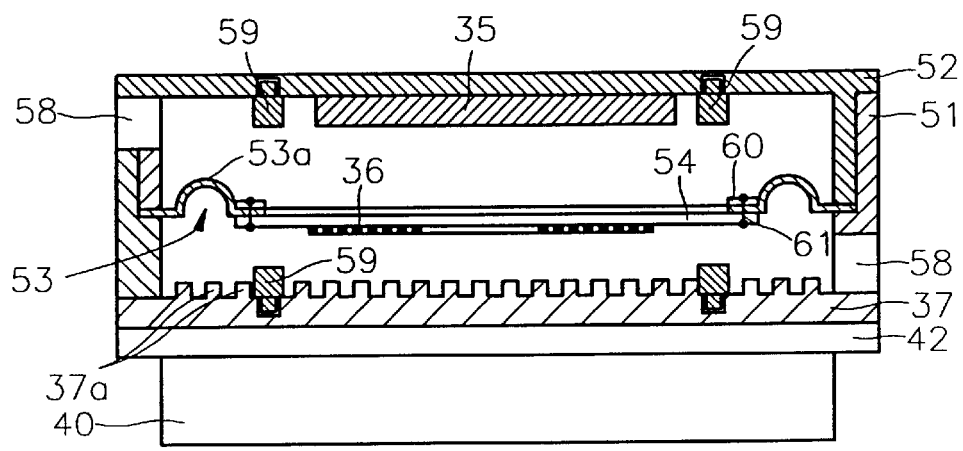
FIG. 5 is a sectional view showing an apparatus for cooling an electronic device according to a second preferred embodiment of the present invention.

FIG. 5 shows a cooling apparatus according to a second preferred embodiment of the present invention. Here, the same reference numerals as those shown in the previous drawings indicate the same members. Referring to the drawing, air intake/exhaust holes 58 through which air comes in and out is formed in a cover member 52 and a frame 51.

According to the preferred embodiment of the present invention, an elastic support film 53 having a bulged portion 53a, and a mobile member 54 are coupled together by a damper 60 and a wire 61. The edge of the elastic support film 53 is supported by being clamped between the cover member 52 and the frame 51.

Also, a stopper 59 is installed to protrude from the lower surface of the cover member 52 and the upper surface of the heat sink 37. The stopper 59 restricting the vibration width of the mobile member 54 is for preventing the mobile member 54 from bumping against the magnet 35 or the heat sink 37. The stopper 59 is preferably formed of a material such as sponge or rubber to absorb bumping impact to the mobile member 54 and formed integrally with the cover member 52 and the heat sink 37.

Figure 6:
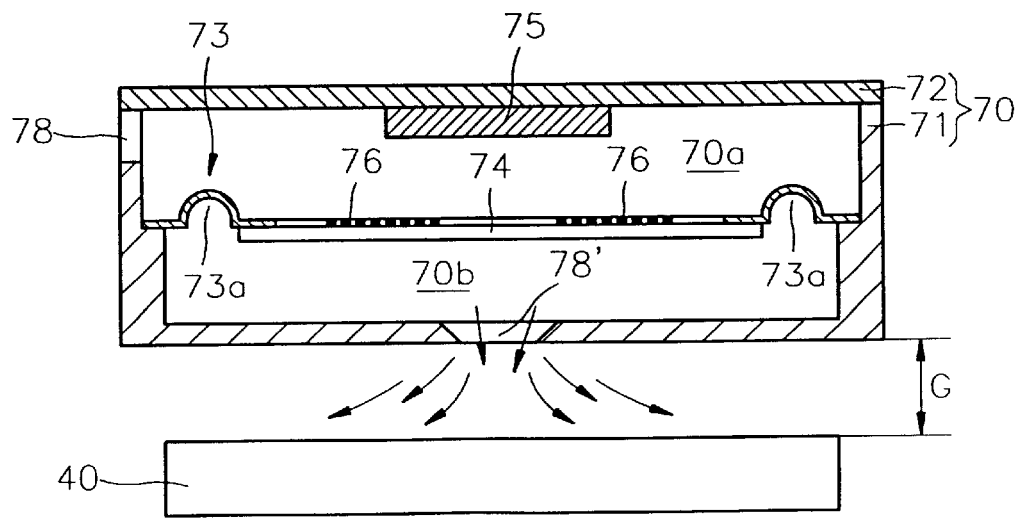
FIG. 6 is a sectional view showing an apparatus for cooling an electronic device according to a third preferred embodiment of the present invention.

Referring to FIG. 6, a cooling apparatus according to a third preferred embodiment of the present invention includes a case 70, a mobile member 74 installed in the case 70, and an elastic support film 73 for supporting the mobile member 74.

A magnet 75 is installed at the cover member 72 of the case 70. Air intake/exhaust holes 78 and 78' are formed at the side and lower surfaces of the frame 71, respectively. A heat source 40 is arranged to be separated a predetermined gap G from the air intake/exhaust hole 78' formed at the lower surface of the frame 71.

The elastic support film 73 having a bulged portion 73a is formed to be circular or a closed loop. The outer circumferential edge of the elastic support film 73 is fixed to the case 70 and the inner circumferential edge thereof is coupled to the mobile member 74.

When current is applied to a coil 76 provided at the mobile member 74, the mobile member 74 vibrates up and down by an electromagnetic force occurring between the coil 76 and the magnet 75 and a restoring force of the elastic support film 73. Thus, as the volume and the pressure of an upper space 70a and a lower space 70b change, the air inside the respective spaces 70a and 70b is exchanged with the outside air. Here, the air escaping through the air intake/exhaust hole 78' formed at the lower surface of the frame 71 directly cools the heat source 40.

Figure 7:
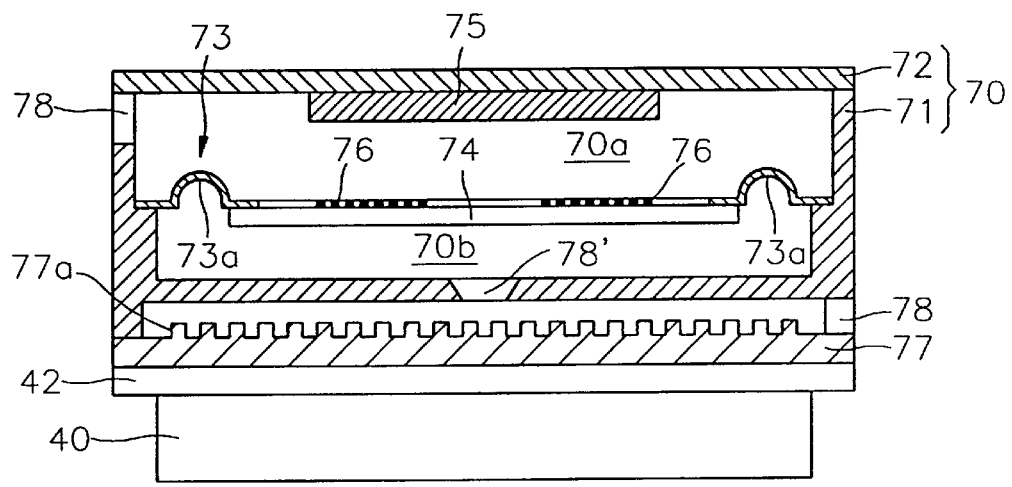
FIG. 7 is a sectional view showing an apparatus for cooling an electronic device according to a fourth preferred embodiment of the present invention.

FIG. 7 shows a cooling apparatus according to a fourth preferred embodiment of the present invention. Here, the same reference numerals as those shown in FIG. 6 indicate the same elements.

According to the present invention, a heat sink 77 where a plurality of cooling fins 77a are formed, and a pad 42, are installed between the case 70 and the heat source 40. The heat sink 77 is installed to be separated a predetermined distance from an air intake/exhaust holes 78'formed at the lower surface of the frame 71, to face each other. Air flows through a gap between the heat sink 77 and the air intake/exhaust hole 78'.

When a vibrating member 74 vibrates by a driving device, as air is injected through the air intake/exhaust hole 78'toward the cooling fin 77a, the heat sink 77 to which heat is transferred from the heat source 40 via the pad 42 can be cooled.

Figure 8:
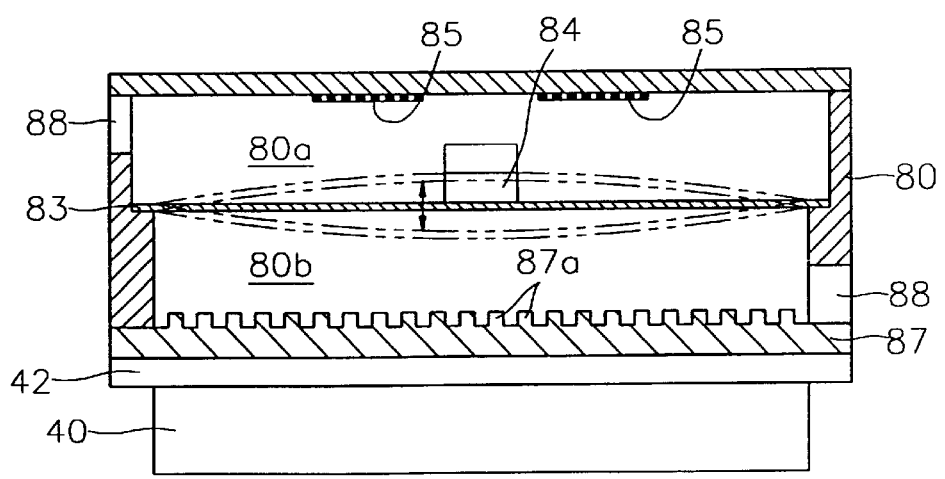
FIG. 8 is a sectional view showing an apparatus for cooling an electronic device according to a fifth preferred embodiment of the present invention.

FIG. 8 shows a cooling apparatus according to a fifth preferred embodiment of the present invention. Referring to the drawing, an elastic film 83 is installed in a case 80 where air intake/exhaust holes 88 are formed, thereby forming an upper space 80a and a lower space 80b. The elastic film 83 is formed of a thin, elastic material such as rubber.

A magnet 84 is installed at the elastic film 83 and a coil 85 corresponding to the magnet 84 is installed on the inner surface of the ceiling of the case 80. A heat sink 87 where a plurality of cooling fins 87a are formed is integrally coupled to the case 80 at the lower side thereof. As the elastic film 83 vibrates up and down by an electromagnetic force occurring between the magnet 84 and the coil 85, the air of the upper and lower spaces 80a and 80b is agitated so that the heat sink 87 which receives heat from the heat source 40 is cooled.

Figure 9:
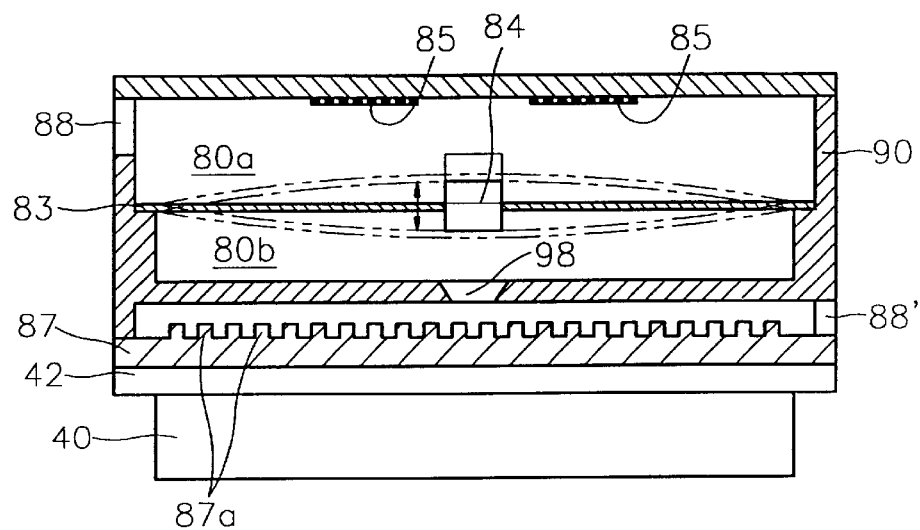
FIG. 9 is a sectional view showing an apparatus for cooling an electronic device according to a sixth preferred embodiment of the present invention.

FIG. 9 shows a cooling apparatus according to a sixth preferred embodiment of the present invention. Referring to the drawing, air intake/exhaust holes 88 and 98 are formed at the side and lower surfaces of a case 90. A heat sink 87 is installed to be separated a predetermined distance from the air intake/exhaust hole, 98. Air flows through another air intake/exhaust hole 88' through a passage between the lower surface of the case 90 and the heat sink 87.

Figure 10:
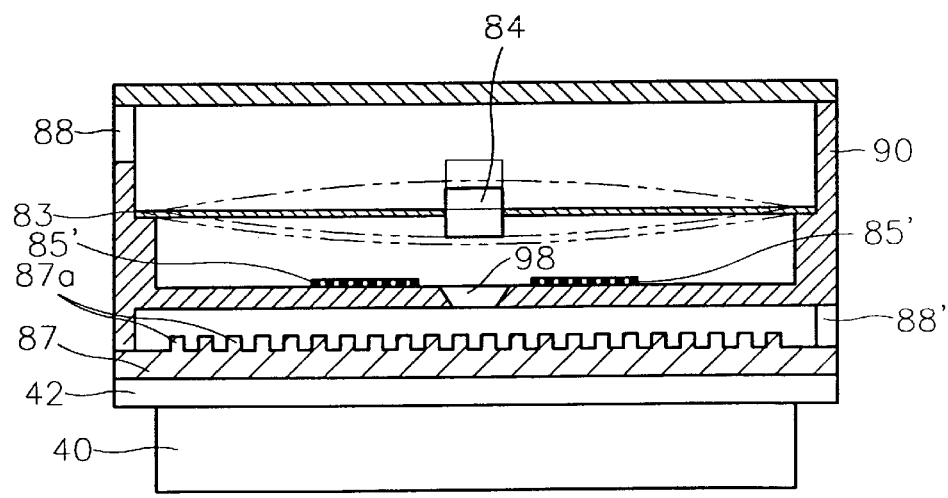
FIG. 10 is a sectional view showing an apparatus for cooling an electronic device according to a seventh preferred embodiment of the present invention.

When an elastic film 83 vibrates, the air in the lower space 80b is exhausted through the air intake/exhaust hole 98 so that a plurality of cooling fins 87a of the heat sink 87 is cooled. Alternatively, as shown in FIG. 10, a coil 85' can be installed at the bottom of the case 90.

As described above, in a cooling apparatus for an electronic device according to the present invention, as a heat sink provided under the case is adopted and the heat sink is cooled by the air flowing due to vibrations of the mobile member, the efficiency of cooling can be improved. Also, as the elastic support film supporting the mobile member requires less amount of elastic deformation compared to the conventional technology, durability is improved.

In the above-described embodiments, it must be understood that the covering members for opening/closing the holes through which air comes in and out are further provided. The above and other features of the invention including various and novel details of construction has been particularly described with reference to the accompanying drawings and pointed out in the claims. It will be understood that the particular cooling apparatus embodying the invention has been shown by way of illustration only and not as a limitation of the invention. The principles and features of this invention may be employed in varied and numerous embodiments without departing from the scope of the invention.

What is claimed is:

1. An apparatus for cooling an electronic device comprising:
   a case in which a plurality of air intake/exhaust holes are formed;
   a plate type mobile member installed to vibrate in the case, the mobile member dividing an inner space of the case into an upper space and a lower space;
   an elastic support film fixed in the case to support the mobile member and having a bulged portion that elastically deforms when the mobile member vibrates; and
   a driving device for vibrating the mobile member, wherein the vibration of the mobile member creates an air flow through the air intake/exhaust holes, such that air in the upper and the lower spaces of the case is exchanged with outside air so that a heat source is cooled.

2. The apparatus as claimed in claim 1, further comprising a heat sink installed between the case and the heat source for cooling heat transferred from the heat source by being exposed to the air flow.

3. The apparatus as claimed in claim 2, wherein the heat sink is integrally formed with a lower portion of the case and faces the mobile member.

4. The apparatus as claimed in claim 2, wherein at least one of the air intake/exhaust holes is formed at a lower surface of the case and the heat sink is space apart a predetermined distance from the lower surface of the case, so that the air flow through the air intake/exhaust hole of the lower surface cools the heat sink.

5. The apparatus as claimed in claim 2, further comprising a pad provided between the heat sink and the heat source to absorb impact transferred to the heat source.

6. The apparatus as claimed in claim 1, wherein the driving device comprises:

a magnet installed on one of a ceiling of the case and a bottom of the case, the magnet facing the mobile member; and a coil installed at the mobile member to correspond to the magnet, wherein the mobile member vibrates by an interactive electromagnetic force occurring between the coil and the magnet.

7. The apparatus as claimed in claim 1, wherein the driving device comprises:

a coil installed on one of a ceiling of the case and a bottom of the case, coil facing the mobile member; and a magnet installed at the mobile member to correspond to the coil, wherein the mobile member vibrates by an interactive electromagnetic force occurring between the coil and the magnet.

8. The apparatus as claimed in claim 1, wherein the air intake/exhaust holes comprise:

an air inlet hole through which outside air only enters into the case; and an air outlet hole through which air in the case is only exhausted.

9. The apparatus as claimed in claim 8, further comprising:

a first covering member which is installed at the inner surface of the case and elastically deforms to open and close the air inlet hole; and a second covering member which is installed at the outer surface of the case and elastically deforms to open and close the air outlet hole, wherein the first and the second covering members are elastically deformed by a difference between a pressure inside the case and a pressure outside the case to open and close the air inlet hole and the air outlet hole.

10. An apparatus for cooling an electronic device comprising:

a case in which a plurality of air intake/exhaust holes are formed;

an elastic film installed to vibrate in the case, the elastic film dividing an inner space of the case into an upper space and a lower space;

a driving device for vibrating the elastic film; and a heat sink installed between the case and a heat source for transferring heat from the heat source, wherein the vibration of the elastic film creates an air flow through the air intake/exhaust holes, such that air in the upper and the lower spaces of the case is exchanged with outside air so that the heat sink is cooled.

11. The apparatus as claimed in claim 10, wherein the heat sink is integrally formed with a lower portion of the case and faces the elastic film.

12. The apparatus as claimed in claim 10, wherein at least one of the air intake/exhaust holes is formed at a lower surface of the case and the heat sink is spaced apart a predetermined distance from the lower surface of the case, so that the air flow through the air intake/exhaust hole of the lower surface cools the heat sink.

13. The apparatus as claimed in claim 10, wherein the driving device comprises:

a coil installed on one of a ceiling of the case and a bottom of the case, the coil facing the elastic film; and a magnet installed at the elastic film to correspond to the coil, wherein the elastic film vibrates by an interactive electromagnetic force occurring between the coil and the magnet.

14. The apparatus as claimed in claim 10, wherein the air intake/exhaust holes comprise:

an air inlet hole through which outside air only enters into the case; and an air outlet hole through which air in the case is only exhausted.

15. The apparatus as claimed in claim 14, further comprising:

a first covering member which is installed at the inner surface of the case and elastically deforms to open and close the air inlet hole; and a second covering member which is installed at the outer surface of the case and elastically deforms to open and close the air outlet hole, wherein the first and the second covering members are elastically deformed by a difference in pressure inside the case and outside the case to open and close the air inlet hole and the air outlet hole.

16. The apparatus as claimed in claim 10, further comprising a pad provided between the heat sink and the heat source to absorb impact transferred to the heat sources.

* * * * *